United States Patent [19]
Lin

[11] Patent Number: 6,108,863
[45] Date of Patent: Aug. 29, 2000

[54] VACUUM CLEANER WITH DUAL BLOWING/SUCTION FUNCTION

[76] Inventor: Yao-Chang Lin, No. 28, Shih-Chia Lane, Shih-Chia Li, Tung Dist., Taichung City, Taiwan

[21] Appl. No.: 09/329,635

[22] Filed: Jun. 10, 1999

[51] Int. Cl.[7] .................................................. A47L 5/14
[52] U.S. Cl. ............................................. 15/346; 15/344
[58] Field of Search ............................. 15/344, 345, 346

[56] References Cited

U.S. PATENT DOCUMENTS

| | | | |
|---|---|---|---|
| 1,383,455 | 7/1921 | Farnsworth | 15/346 |
| 2,064,344 | 12/1936 | Good | 15/346 |
| 2,224,202 | 12/1940 | Smellie | 15/346 |
| 2,238,541 | 4/1941 | Spagnolo | 15/346 |
| 2,272,579 | 1/1942 | Chamberlin et al. | 15/346 |
| 3,268,942 | 8/1966 | Rossnan | 15/346 |
| 3,694,848 | 10/1972 | Alcala | 15/346 |
| 4,175,352 | 11/1979 | Catlett | 15/316 |
| 5,613,269 | 3/1997 | Miwa | 15/346 |
| 5,722,111 | 3/1998 | Sowell et al. | 15/346 |

FOREIGN PATENT DOCUMENTS

| | | | |
|---|---|---|---|
| 2 455 878 | 1/1981 | France | 15/346 |
| 661573 | 6/1938 | Germany | 15/346 |
| 30 10 130 | 9/1981 | Germany | 15/346 |

*Primary Examiner*—Theresa T. Snider
*Attorney, Agent, or Firm*—Christie, Parker & Hale, LLP

[57] ABSTRACT

A vacuum cleaner with dual blowing/suction function includes a main housing having at least one air inlet and at least one air outlet; at least one fan mounted in the main housing and having a suction side adjacent to the air inlet and a blowing the adjacent to the air outlet; a motor disposed in the main body for driving the fan; a tubular member having a first open end connected to the air inlet and a second open end; a blowing duct extending inside the tubular member and having a spout adjacent the second open end; a blowing pipe having an inner end connected to the air outlet and an outer end connected in fluid communication with the blowing duct; and a dust collecting member and a filter member disposed between and connected to the tubular member and the air inlet of the main housing. In operation, a suction air stream and a blowing air stream are simultaneously generated in the second open end of the tubular member, the blowing air stream serving to stir the dirt and dust particles in an article to be cleaned while the suction air stream draws in the air along with the stirred dirt and dust particles into the dust collecting member.

16 Claims, 10 Drawing Sheets

VACUUM CLEANER WITH DUAL BLOWING/SUCTION FUNCTION

BACKGROUND OF THE INVENTION

1. Field of the Invention

The present invention relates to a vacuum cleaner, more particularly to a vacuum cleaner of an improved construction capable of simultaneously generating blowing and suction air streams so as to achieve a more thorough and effective removal of dirt and dust particles.

2. Description of the Related Art

Vacuum cleaners find wide applications be it in industry or in homes. Vacuum cleaners in general operate by suction to remove the contaminants, dirt or dust particles from an article to be cleaned. Vacuum cleaners of this type have to be maintained with a strong suction force and the suction mouthpiece thereof is normally placed in close contact with the surface of the article to be cleaned to effect removal of dirt and/or dust thereon. For articles having an uneven surface with convexities and concavities, such as electronic parts, carpets and woolen knitwear or materials, the suction mouthpiece of the vacuum cleaner is usually incapable of reaching the deeper and inner parts of such articles, and might even have difficulty in moving over the surface of the article to be cleaned. The mere suction function of the vacuum cleaner thus cannot be relied upon to effectively remove the contaminants, dirt or dust in the deepest part of such articles of uneven surfaces. In other words, only the surface dirt and dust on an article to be cleaned can be removed by such a vacuum cleaner, leaving behind the dirt and dust concealed in the deeper and inner part of the article. Thus, such a vacuum cleaner does not provide a thorough and fully effective cleaning.

In view of the drawback of such type of vacuum cleaners having a single suction function, those engaged in the related field consequently developed a vacuum cleaner designed to have both blowing and suction capabilities, which generally has a construction as shown in FIG. 1. The vacuum cleaner which is operable in the blowing or suction mode, as shown in the drawing, essentially comprises a tubular member 11 mounted on a main body 10. A switching valve 12 is disposed axially inside the tubular member 11. The switching valve 12 is rotatable and has two air passages 121 at one end thereof which are in fluid communication with the tubular member 11. A dust collecting pouch 13 is provided at the rear end of the main body 10. The lower end of the main body 10 may be connected to a source of air (such as an air compressor) via a tube (not shown). By pressing a handle 14, air is allowed to enter into the air passages 121 of the switching valve 12. When the air passages 121 of the switching valve 12 face toward the front of the tubular member 11 (see FIG. 1), the air is blown forward and outwardly from the front end of the tubular member 11 to form a blowing air stream, which is forced onto the article to be cleaned to stir and remove the surface dirt or dust. When the switching valve 12 is rotated so that the air passages 121 face the rear portion of the tubular member 11 (as best shown in FIG. 2), the air flows toward the inside to the rear end of the tubular member 11 into the dust collecting pouch 13 (see direction of arrow in FIG. 2), thus forming a suction air stream at the front end of the tubular member 11 for drawing in the dust on the surface of the article to be cleaned into the dust collecting pouch 13. The dual blowing and suction function for removing dirt or dust is thus achieved.

While the vacuum cleaner design described above has dual blowing and suction functions, some disadvantages in terms of its dust removing ability and ease of use are still noted. Specifically, this dual-function vacuum cleaner utilizes the switching valve 12 for changing the air flow direction in the tubular member 11 to achieve either a blowing or a suction effect. Therefore, such prior vacuum cleaners can only be switched to perform a single operation at a time, i.e., the on/off switch is used to change the air flow direction to switch the blowing function to suction function or vice-versa. In other words, the two operations of blowing and suction cannot be performed at the same time. Furthermore, the blowing and suction force of such a vacuum cleaner is insufficiently strong and, thus, the dust-removing effect is ultimately limited. In addition, when such vacuum cleaner is operated in the blowing mode for removing dirt or dust particles, the blowing air stream stirs up and scatters the dust around. The dusty surroundings caused thereby make breathing difficult and affects human health. Moreover, the scattered and flying dirt or dust particles will eventually settle on the ground so that the user must subsequently perform a cleaning/sweeping operation. Therefore, cleaning using such a vacuum cleaner is troublesome and time-consuming. Apart from the foregoing, when performing the suction operation, the front end opening of the tubular member 11 which serves as the suction mouthpiece must be adhered as closely as possible to the surface of the article to be cleaned for an effective suction of the dirt or dust particles. However, if the article to be cleaned has an uneven surface, or has elements thereon which can be easily broken upon contact (such as electronic circuit boards), the suction mouthpiece should not be placed too closely on the surface of the article to be cleaned and, naturally therefore, the cleaning operation is neither effective nor efficient.

The present invention is thus contrived in an attempt to alleviate the above shortcomings of the prior art.

SUMMARY OF THE INVENTION

Accordingly, a main object of the present invention is to provide a vacuum cleaner of an improved construction providing simultaneous blowing and suction operations for effecting a thorough and efficient dirt and dust removal effect, as well as a strong suction force to suck up the dirt and dust particles on the surface of an article to be cleaned and those stirred by the blowing air stream.

Accordingly, the vacuum cleaner according to the present invention comprises a main housing having at least one air inlet and at least one air outlet; at least one fan mounted in said main housing and having a suction side adjacent to said air inlet and a blowing side adjacent to said air outlet; a motor disposed in said main body for driving said fan; a tubular member having a first open end connected to said air inlet and a second open end; a blowing duct extending inside said tubular member and having a spout adjacent said second open end; a blowing pipe having an inner end connected to said air outlet and an outer end connected in fluid communication with said blowing duct; and a dust collecting member and a filter member disposed between and connected to the tubular member and said air inlet of said main housing, whereby a suction air stream and a blowing air stream are simultaneously generated in said second open end of said tubular member, the blowing air stream serving to stir the dirt and dust particles in an article to be cleaned while the suction air stream draws in the air along with the stirred dirt and dust particles into the main housing.

BRIEF DESCRIPTION OF THE DRAWINGS

Other features and advantages of the present invention will become apparent in the following detailed description of the preferred embodiment with reference to the accompanying drawings, in which.

DETAILED DESCRIPTION OF THE PREFERRED EMBODIMENT

Figure 1:
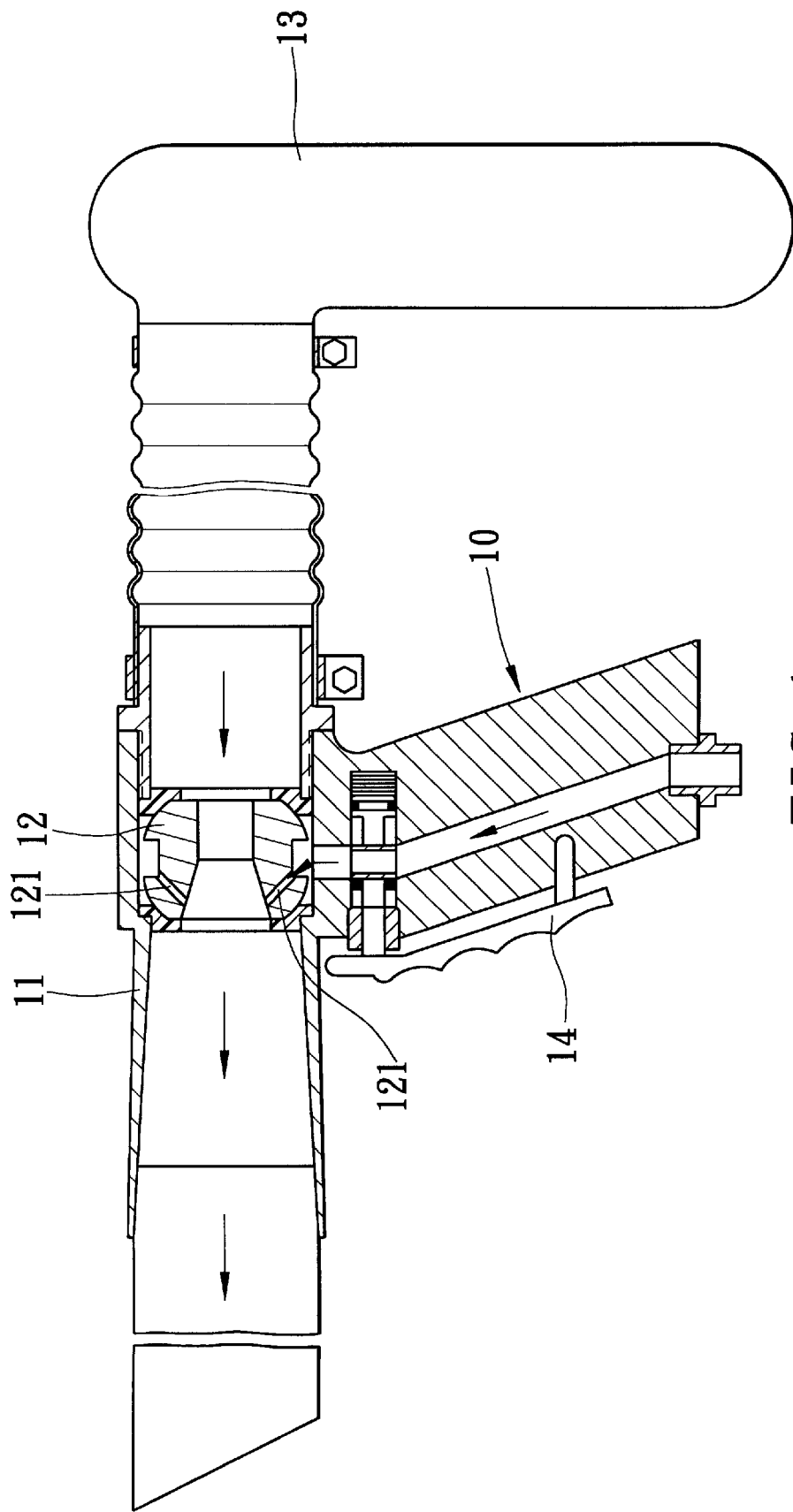
FIG. 1 is a schematic view of a prior art vacuum cleaner in the blowing mode.
Figure 2:
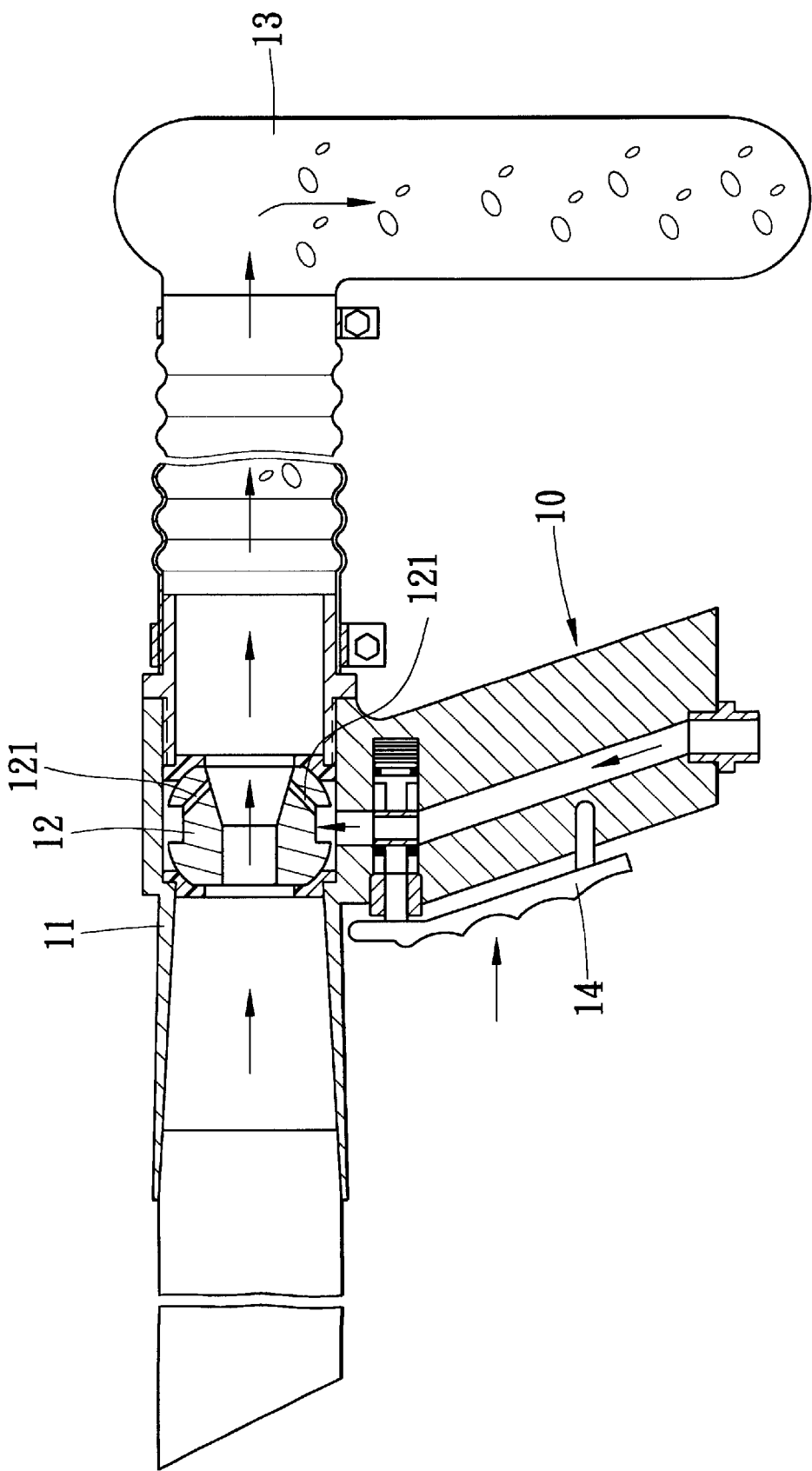
FIG. 2 is a schematic view of a prior art vacuum cleaner in the suction mode.
Figure 3:
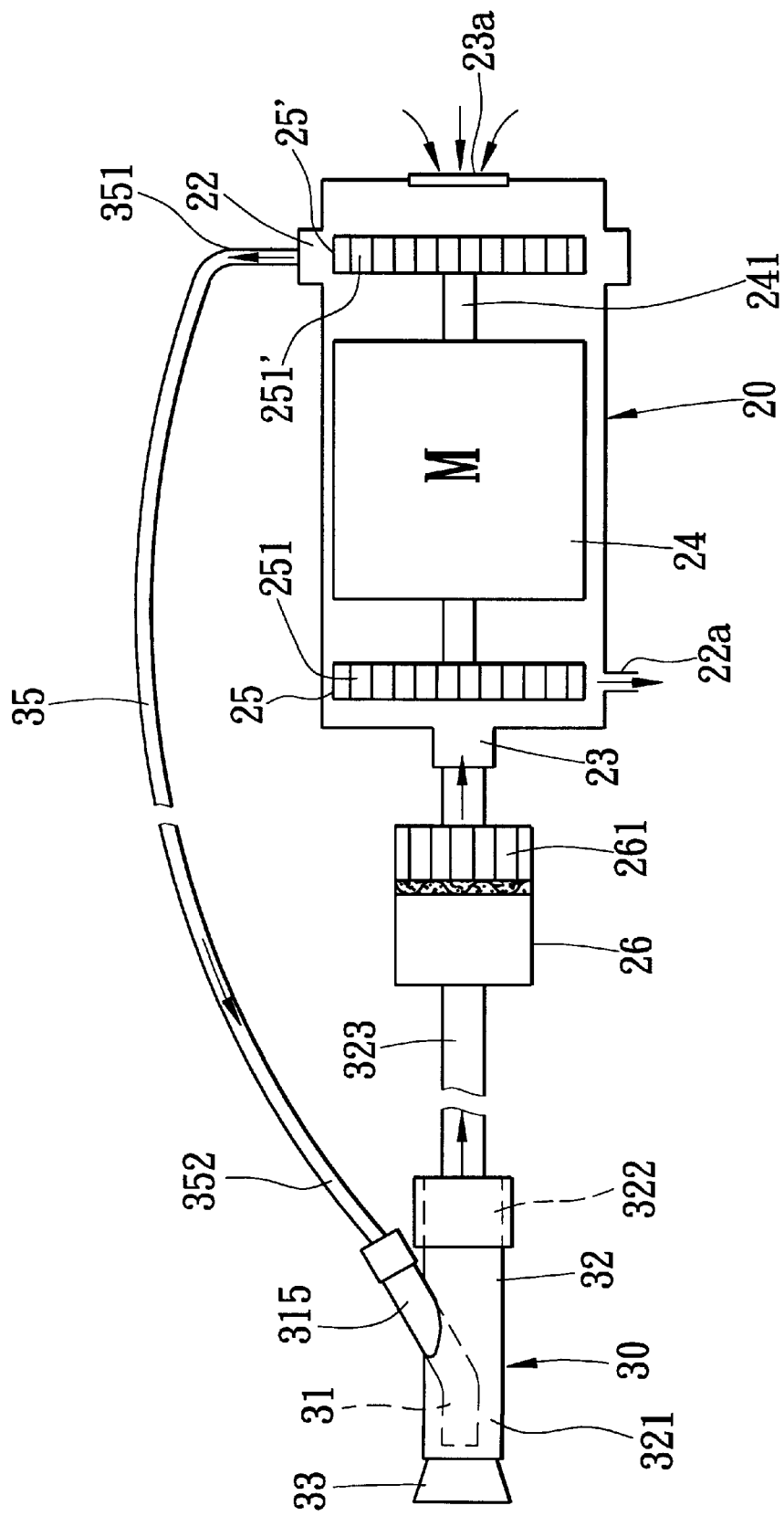
FIG. 3 is a schematic view of a preferred embodiment of the vacuum cleaner according to the present invention.

The construction of a preferred embodiment of the vacuum cleaner according to the present invention will now be described in greater detail as follows:

Referring to FIG. 3, a vacuum cleaner according to the present invention essentially comprises a main housing 20; a pair of fans 25, 25' and a motor 24 disposed in the main housing 20; a tubular member 30 for passage of a suction air stream; a blowing pipe 35 for passage of a blowing air stream; a blowing duct 31 disposed in the tubular member 30; and a dust collecting member 26 and a filter member 261 provided between the tubular member 30 and the main housing 20.

The main housing 20, in the embodiment shown, has a pair of air inlets 23,23a and a pair of air outlets 22,22a. The motor 24 has an output shaft 241 and the pair of fans 25 are respectively connected to both ends of the output shaft 241 on opposite sides of the motor 24 in an axially spaced-apart arrangement. The pair of fans 25,25' each include a plurality of centrifugal-type blades 251,251' for generating a blowing and a suction air stream. The fan blades 251,251' are oriented in different directions such that the fan 25 has a suction side adjacent the air inlet 23 and a blowing side adjacent the air outlet 22a of the main housing 20, while the fan 25' has a suction side adjacent the air inlet 23a and a blowing side adjacent the air outlet 22 of the main housing 20. While a pair of fans 25, 25' are illustrated in the preferred embodiment, a single fan may also be used to achieve the same purpose and effect.

Figure 4:
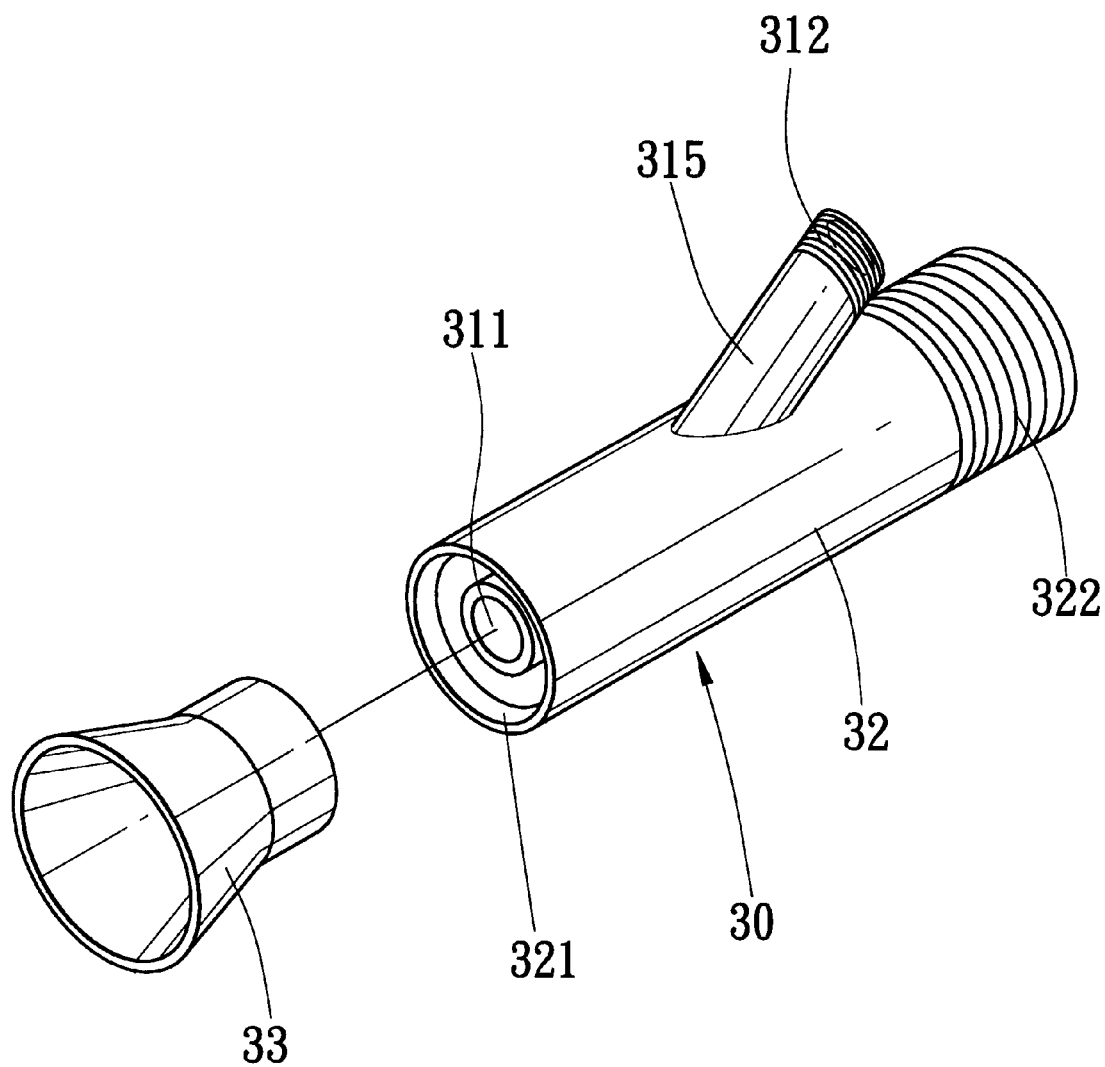
FIG. 4 is a perspective view showing the tubular member and the mouthpiece of the vacuum cleaner of FIG. 3.
Figure 5:
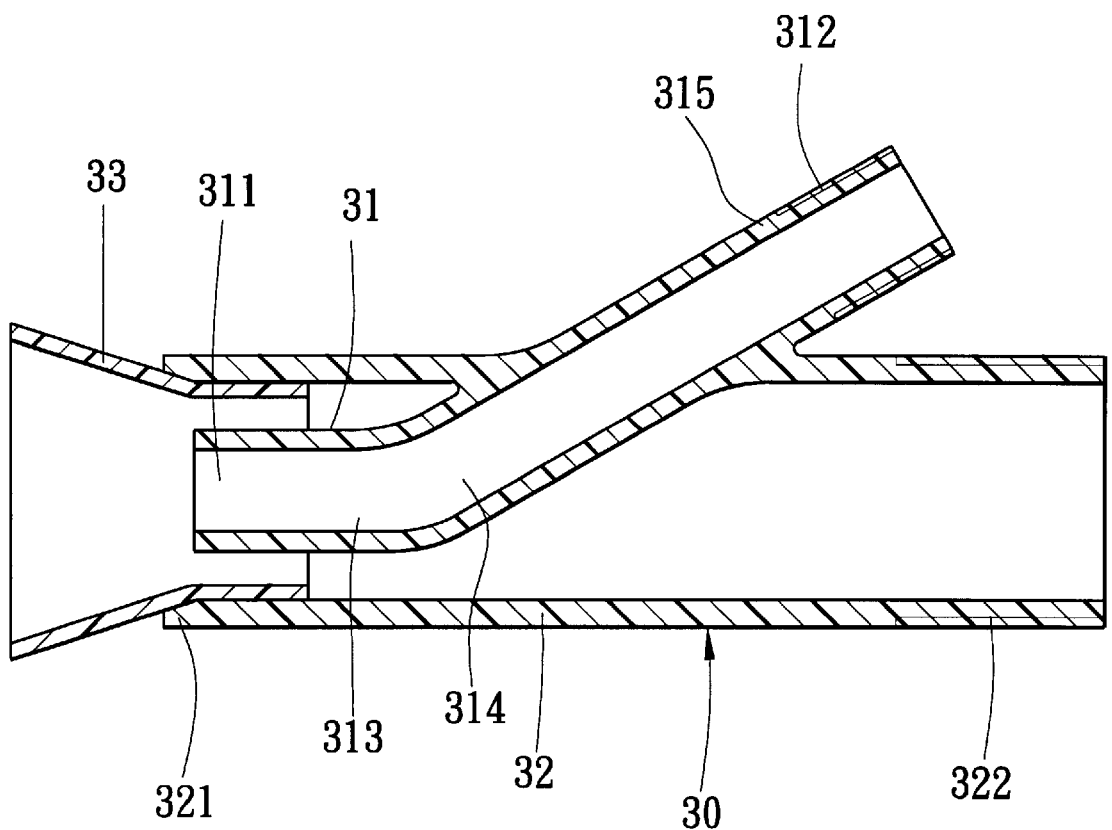
FIG. 5 is a sectional side view showing the tubular member and the mouthpiece of FIG. 4.
Figure 6:
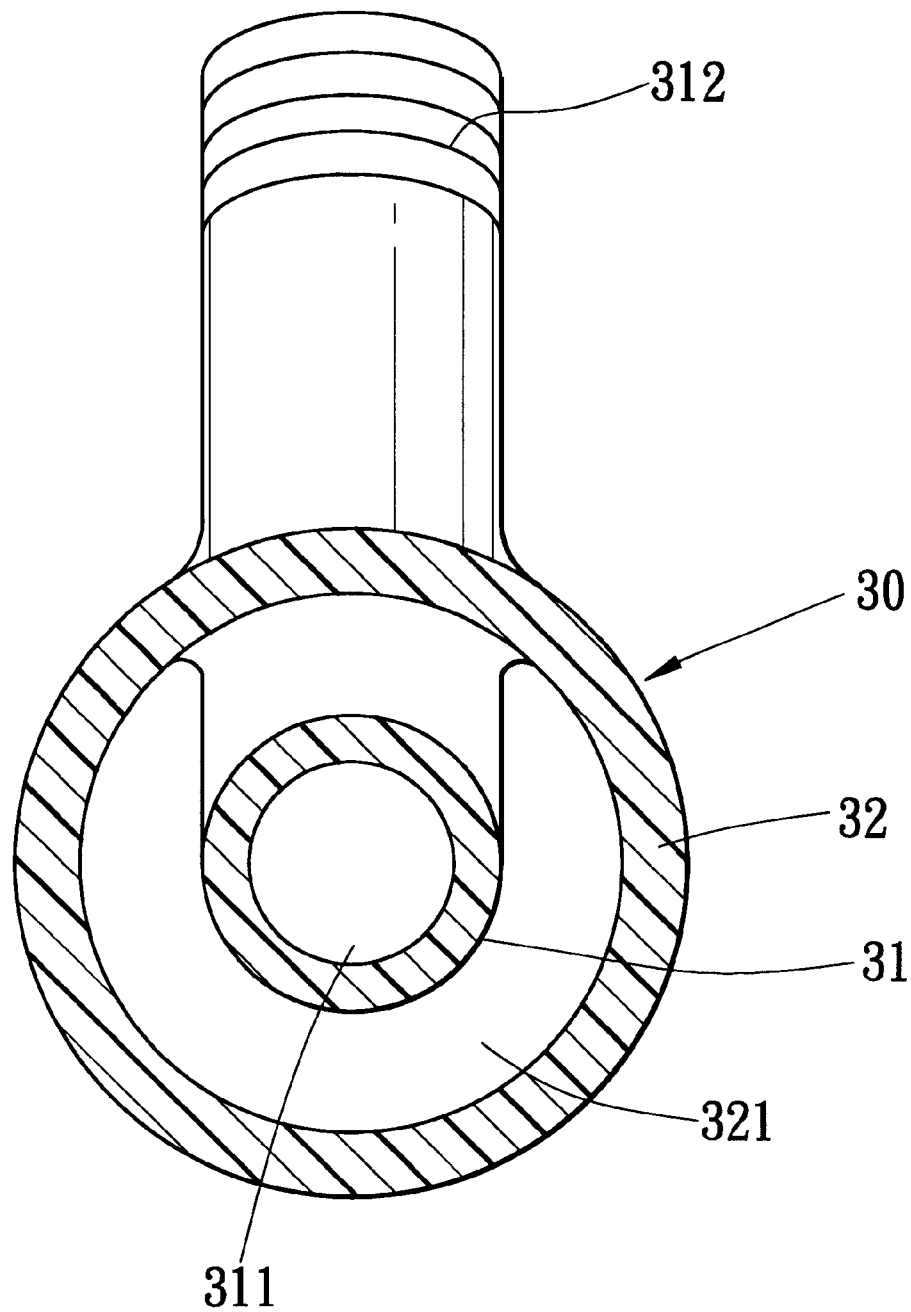
FIG. 6 is a sectional front view of the tubular member of FIG. 4.

The tubular member 30 has an externally threaded first open end 322 connected to the air inlet 23 of the main housing 20 via a conduit 323 passing through the dust collecting member 26 and filter member 261. The blowing duct 31 extends into a second open end 321 of the tubular member 30. In the preferred embodiment, the tubular member 30 and the blowing duct 31 are of circular cross sections, as shown in FIGS. 4, 5 and 6. However, the tubular member 30 and the blowing duct 31 may have other configurations, such as those shown in FIGS. 10 and 11, which will be described in greater detail later. Referring to FIGS. 4, 5 and 6, the blowing duct 31 consists of a first section 314 extending obliquely to the tubular wall 32 of the tubular member 30, and a second section 313 extending axially from the first section 314 to form a spout 311. The spout 311 and the second section 313 of the blowing duct 31 are disposed inward in the center of the second open end 321 of the tubular member 30 in a substantially concentric arrangement.

The blowing pipe 35 has an inner end 351 connected to the air outlet 22 of the main housing 20 and an outer end 352 connected in fluid communication with the blowing duct 31.

Preferably, the tubular member 30 is further provided with an exterior branch portion 315 extending outwardly from the tubular wall 32 and communicating with the first section 314 of the blowing duct 31. The exterior branch portion 315 has a threaded end portion 312 for connection with corresponding threaded portion (not shown) provided on the outer end 352 of the blowing pipe 35.

Figure 7:
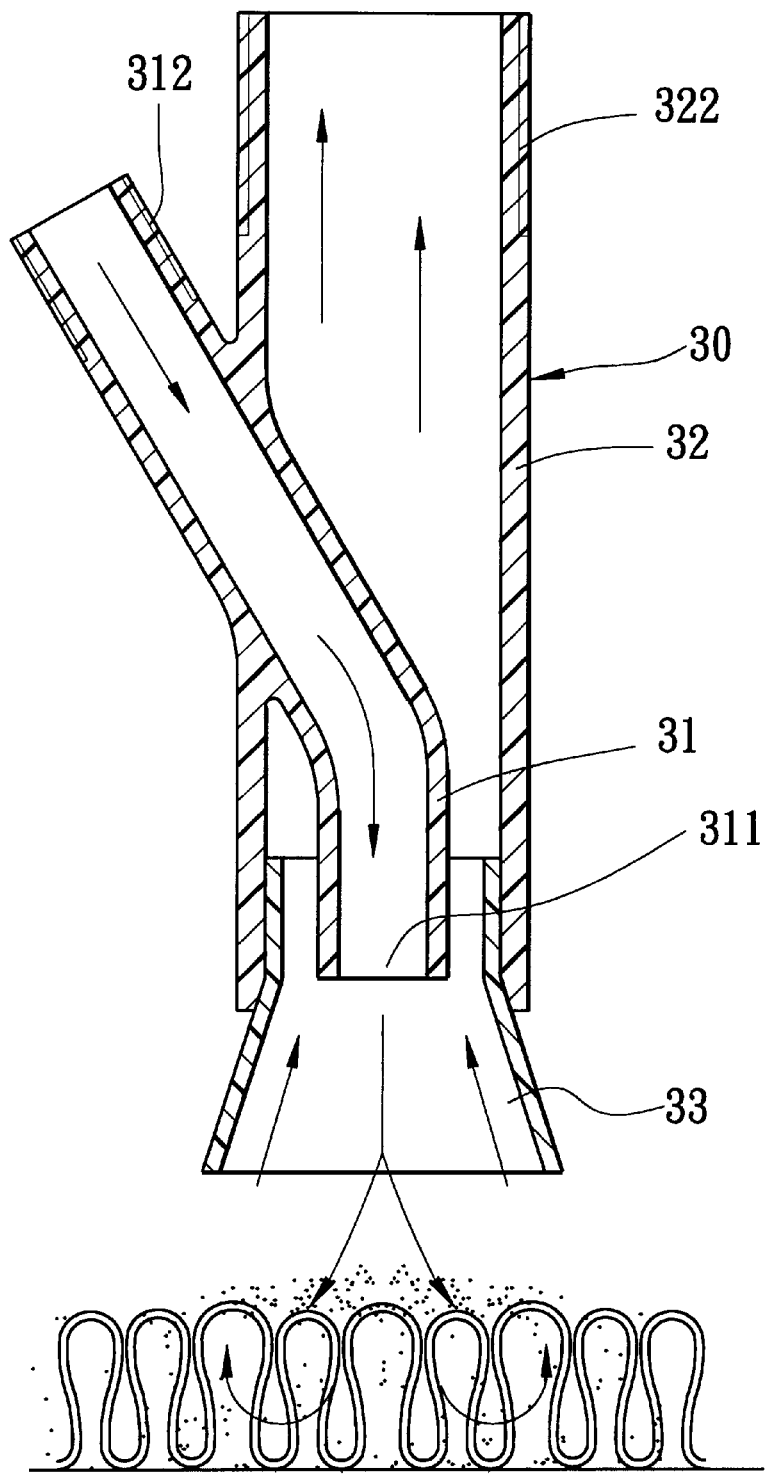
FIG. 7 is a view showing the tubular member of FIG. 4 in an operational state to clean a carpet.

The operation and intended effects of the present will now be described, with reference to FIGS. 7 and 8. The article to be cleaned shown in FIG. 7 is a carpet or other woolen or knitted material or the like. In use, the vacuum cleaner is switched on to start the motor 24. The motor 24 drives the fan blades 251,251' of the fans 25, 25' into rotation to thereby simultaneously generate a suction air stream adjacent the air inlet 23 and a blowing air stream adjacent the air outlet 22. As a consequence, a suction effect is produced at the second open end 321 of the tubular member 30, while the generated blowing air stream passes through the blowing pipe 35 and out of the spout 311 of the blowing duct 31 thereby causing an air blowing effect. When the second open end 321 of the tubular member 30 is moved closely over the article to be cleaned (but not necessarily contacting the surface of the article), the blowing air stream emanating from the spout 311 stirs the dust and dirt on the article to be cleaned and even those in the innermost part of the article, whereas the suction air stream going into the second open end 321 of the tubular member 30 draws in the dirt or dust particles stirred by the blowing air stream which are spreading on the surroundings, giving them no chance to fall and settle on the ground. From the second open end 321 of the tubular member 30, the suction air stream along with the entrapped dirt and dust particles passes through the conduit 323. The dirt and dust particles entrained in the suction air stream are screened by the filter member 261 and are thus collected in the dust collecting member 26. The continuous and simultaneous cyclic generation of the suction and blowing air streams thus achieves an effective and efficient cleaning and dust-removing effect. Moreover, the suction end of the tubular member 30 need only be placed close to, without touching, the article to be cleaned.

Figure 8:
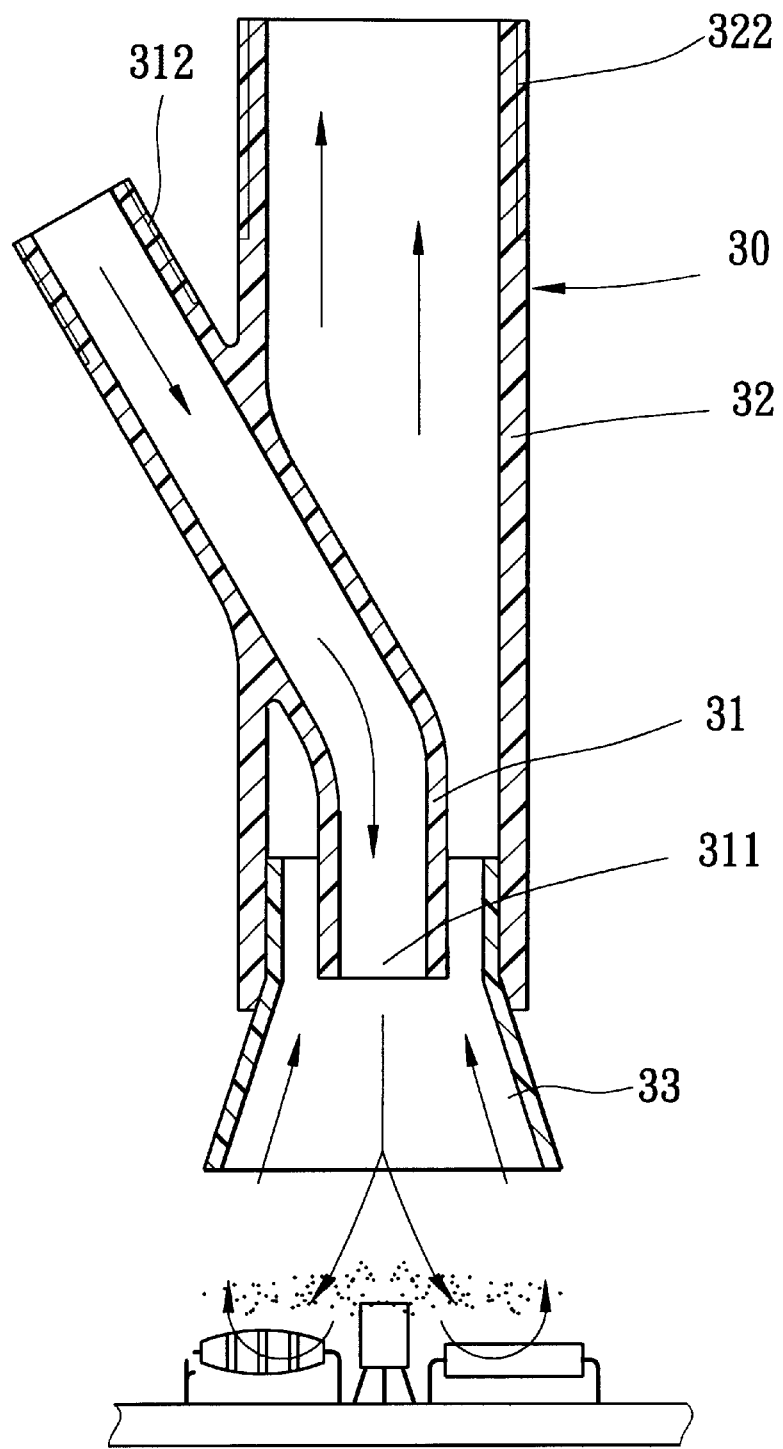
FIG. 8 is another view showing the tubular member of FIG. 4 in an operational state to clean an electronic component.

FIG. 8 shows the cleaning operation of an electronic device, such as a circuit board, using the vacuum cleaner of the present invention. The circuit board has an uneven surface because of the numerous electronic elements attached thereon and the mounting legs of the electronic elements could easily break by mere touch. For these reasons, circuit boards are generally fairly difficult to clean. With the present invention, however, the dust-removing and cleaning effect is doubled compared with the prior art since the dirt or dust particles remaining in the dead comers or deepest or innermost part of the circuit board elements can be removed by the simultaneous blowing and suction functions of the vacuum cleaner. Most importantly, however, the present invention can achieve the effect of cleaning and removing dirt or dust without the need to contact the surface of the object to be cleaned, thus preventing inadvertent breakage of the electronic elements.

Figure 9:
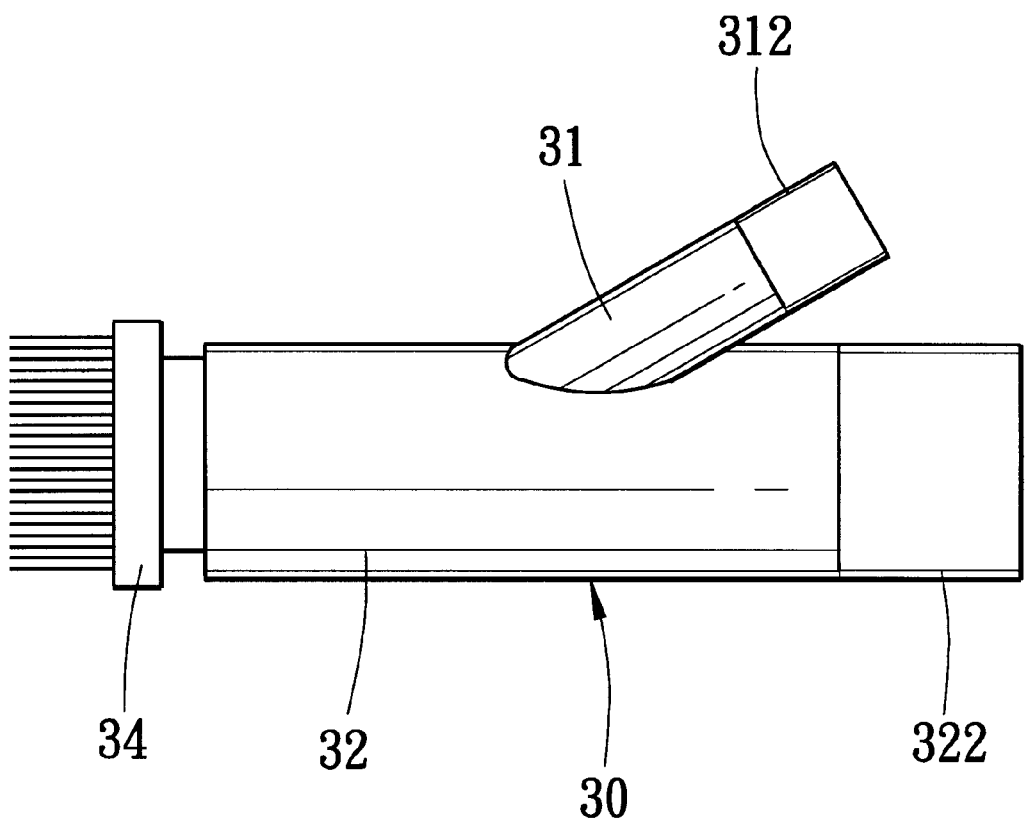
FIG. 9 shows the tubular member attached with a brush member.

A hopper-shaped mouthpiece 33 may be further attached, such as via a snug fit, to the second open end 321 of the tubular member 30, as shown in FIGS. 4 and 5. The wider open end of the mouthpiece 33 allows for greater suction area. Alternatively, a brush member 34 may be sleeved into the second open end 321 of the tubular member 30, as shown in FIG. 9. The brush member 34 is adapted to contact the surface of the article to be cleaned and provide a sweeping action at the same time that the dust-removing action is being performed.

The present invention provides a practical and convenient cleaning device, in particular for delicate devices having uneven surfaces, such as electronic devices having elements which can easily break upon contact. Moreover, as a result of the simultaneous suction and blowing operations, the present invention not only would not cause a dusty surrounding during a cleaning operation, but allows the cleaning operation to be completed in one step. The present invention achieves an effective dirt and dust removing effect and is very practical and convenient in use.

Figure 10:
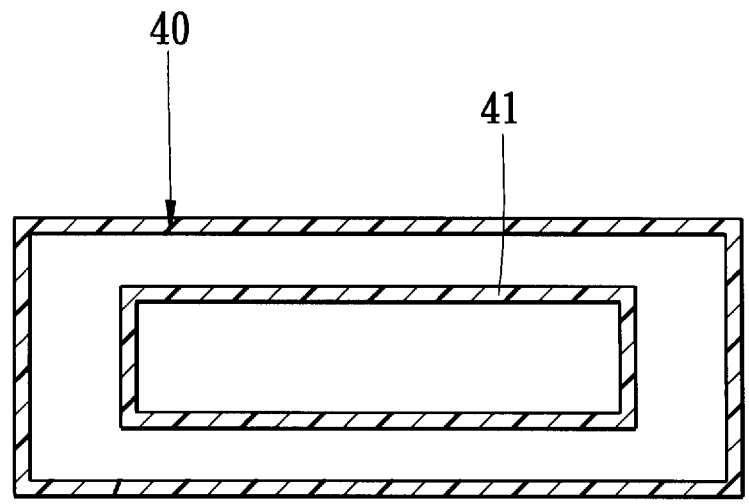
FIG. 10 is a cross sectional view of a second preferred embodiment of the tubular member of the present invention.
Figure 11:
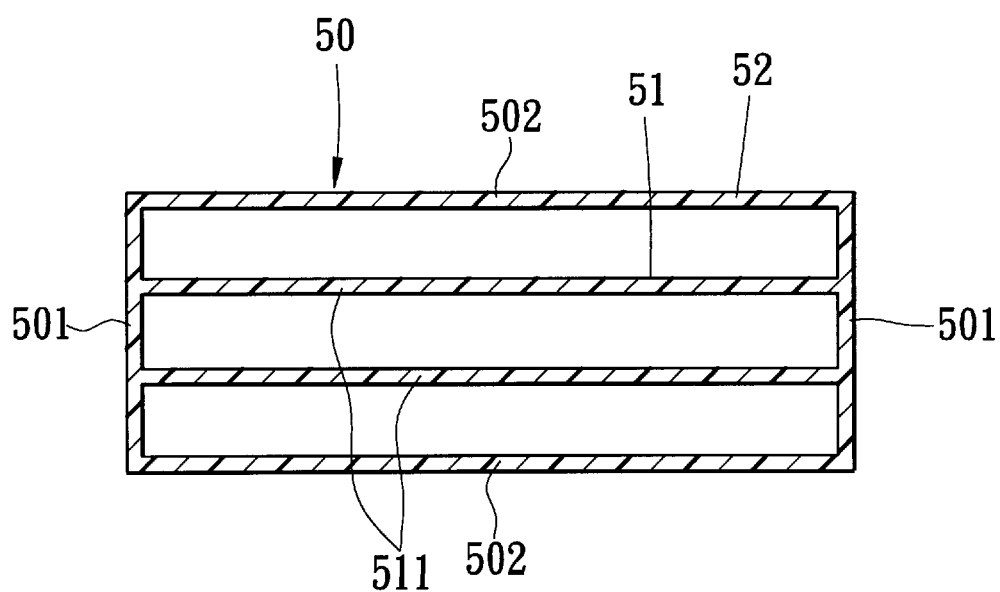
FIG. 11 is a cross sectional view of a third preferred embodiment of the tubular member of the present invention.

As mentioned above, the tubular member 30 and the blowing duct 31 may be embodied in various configurations in consideration of the form that would provide the most effective cleaning function under different circumstances. An alternative configuration is shown in FIG. 10. As shown, a rectangular blowing duct 41 is centered with respect to a rectangular tubular member 40. This configuration is suitable for the cleaning operation of a large area (such as floors). With reference to FIG. 11, another alternative configuration is shown to consist of a tubular member 50 having a tubular wall 52 and a blowing duct 51. The tubular wall 52 is of rectangular cross section and has two pairs of opposite sides 501,502. The blowing duct 51 is formed as one piece with the tubular member 50 by two opposing walls 511 extending across and connected to the pair of opposite sides 501 of the tubular wall 52. This configuration is suitable for use in a working environment of specific requirements.

The technical concept and features of the present invention can be implemented in existing vacuum cleaners used in homes, factories, offices, transportation, as well as in vacuum devices for cleaning other equipment or articles.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A vacuum cleaner comprising:
    a main housing having at least one air inlet and at least one air outlet;
    at least one fan mounted in said main housing and having a suction side adjacent to said air inlet and a blowing side adjacent to said air outlet;
    a motor disposed in said main housing for driving said fan;
    a tubular member having a first open end connected to said air inlet and a second open end;
    a blowing duct extending inside said tubular member and having a spout adjacent said second open end;
    a blowing pipe having an inner end connected to said air outlet and an outer end connected in fluid communication with said blowing duct; and
    a dust collecting member and a filter member disposed between and connected to the tubular member and said air inlet of said main housing;
    whereby a suction air stream and a blowing air stream are simultaneously generated in said second open end of said tubular member, the blowing air stream serving to stir dirt and dust particles in an article to be cleaned while the suction air stream drawing in the air along with the stirred dirt and dust particles into the dust collecting member.

2. The vacuum cleaner of claim 1, wherein the main housing has a pair of the air inlets and a pair of the air outlets, the motor having an output shaft, a pair of the fans being connected to the output shaft and spaced apart from one another, one of the air inlets and one of the air outlets being disposed adjacent each of the fans, the first open end of the tubular member being connected to one of the air inlets adjacent to one of the fans, and the inner end of the blowing pipe being connected to one of the air outlets adjacent the other one of the fans.

3. The vacuum cleaner of claim 2, wherein said fans are mounted on said output shaft at two opposite sides of said motor.

4. The vacuum cleaner of claim 2, wherein each of said fans includes a plurality of centrifugal-type fan blades.

5. The vacuum cleaner of claim 2, wherein said spout is centered with respect to said second open end of said tubular member.

6. The vacuum cleaner of claim 5, wherein said blowing duct and said tubular member have circular cross sections.

7. The vacuum cleaner of claim 5, wherein said blowing duct and said tubular member have rectangular cross sections.

8. The vacuum cleaner of claim 2, wherein said blowing duct is formed as one piece with said tubular member.

9. The vacuum cleaner of claim 8, wherein the tubular member further includes a tubular wall, the blowing duct further having a first section extending obliquely to the tubular wall for connection with the blowing pipe, and a second section extending axially from said first section to said spout.

10. The vacuum cleaner of claim 9, wherein said second section is centered with respect to said tubular wall.

11. The vacuum cleaner of claim 8, wherein the tubular member further includes a tubular wall, the blowing duct having two opposing walls extending across and connected to the tubular wall.

12. The vacuum cleaner of claim 11, wherein the tubular wall is of rectangular cross section and has two pairs of opposite sides, the opposing walls of the blowing duct being connected to one of the pairs of the opposite sides of the tubular wall.

13. The vacuum cleaner of claim 9, wherein the tubular member further includes an exterior branch portion extending outwardly from the tubular wall and communicating with the first section of the blowing duct.

14. The vacuum cleaner of claim 13, wherein said branch portion is formed as one piece with the tubular member and the blowing duct.

15. The vacuum cleaner of claim 2, further comprising a hopper-shaped mouth piece connected to the second open end of the tubular member.

16. The vacuum cleaner of claim 2, further comprising a brush member connected to the second open end of the tubular member.

* * * * *